United States Patent [19]

Mehrgardt

[11] Patent Number: 4,799,212
[45] Date of Patent: Jan. 17, 1989

[54] CIRCUIT FOR CONTROLLING TWO SIGNALS APPROXIMATELY 90 DEGREE APART IN PHASE

[75] Inventor: Soenke Mehrgardt, March, Fed. Rep. of Germany

[73] Assignee: Deutsche ITT Industries GmbH, Freiburg, Fed. Rep. of Germany

[21] Appl. No.: 22,833

[22] Filed: Mar. 6, 1987

[30] Foreign Application Priority Data

Mar. 15, 1986 [DE] Fed. Rep. of Germany ..... 86103522

[51] Int. Cl.⁴ .............................................. H04J 11/00
[52] U.S. Cl. ........................................ 370/20; 358/35
[58] Field of Search ................... 370/20, 19; 358/35; 375/39

[56] References Cited

U.S. PATENT DOCUMENTS

| | | | |
|---|---|---|---|
| 4,027,105 | 5/1977 | Kannowade | 370/20 |
| 4,174,522 | 11/1979 | Taguchi | 358/35 |
| 4,489,392 | 12/1984 | Lewis | 364/724 |
| 4,686,569 | 8/1987 | Campbell | 358/35 |
| 4,710,814 | 12/1987 | Gassmann et al. | 370/20 |

FOREIGN PATENT DOCUMENTS

| | | | |
|---|---|---|---|
| 0179948 | 10/1984 | European Pat. Off. | 9/64 |
| 0122538 | 10/1984 | European Pat. Off. | 9/12 |
| 2538657 | 6/1984 | France | 9/44 |

*Primary Examiner*—Douglas W. Olms
*Attorney, Agent, or Firm*—T. L. Peterson

[57] ABSTRACT

This control circuit adjusts two signal waveforms to a phase difference of exactly 90° and to exactly equal amplitudes of the respective frequency components. It is a digital circuit containing a phase control stage (pr) and an amplitude control stage (ar). The control circuit (r) delivers first and second quadrature signals (q1, q2) which are multiplied together to obtain a phase control value (p) which is multiplied by one of the digitized quadrature analog signals and added vectorially to the second digital signal. The two signals thus brought to a phase difference of exactly 90° are the two phase-corrected digital signals (p1, p2). In the amplitude control stage (ar), one of the two phase-corrected digital signals (p2, p1) is multiplied by the amplitude control value (g) from the amplitude comparator (av1, av2), and the product is the amplitude- and phase-corrected quadrature signal (q2, q1) belonging to the other quadrature signal (q1, q2).

35 Claims, 3 Drawing Sheets

CIRCUIT FOR CONTROLLING TWO SIGNALS APPROXIMATELY 90 DEGREE APART IN PHASE

BACKGROUND OF THE INVENTION

Figure 1:
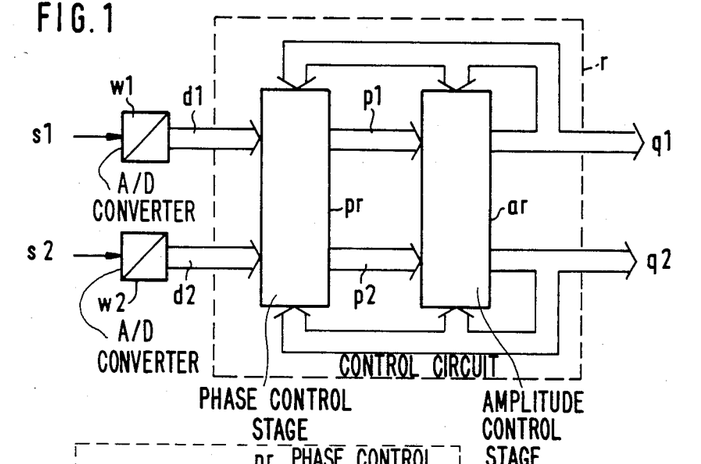
FIG. 1 is a block diagram of the control circuit.

The present invention relates to a circuit for controlling two signals approximately 90° apart in phase so as to obtain two signal waveforms having a phase difference of exactly 90° and exactly equal amplitudes, as set forth in the preamble of Claim 1. A control circuit of this kind is described in Offenlegungsschrift DE-A-33 13 867. FIG. 1 and the description thereof on page 8, line 1, to page 11, line 6, serve to explain this control circuit, which includes a phase control stage and an amplitude control stage. The control circuit forms part of a superheterodyne receiver which converts a received composite radio-frequency signal—in that case a composite color signal—directly to the baseband with the aid of a radio-frequency quadrature mixer using the "third method", with the upper sideband and the lower sideband being placed one upon another. By means of an audiofrequency quadrature mixer, the composite signal is converted to the usual AF value, the undesired sideband being suppressed; cf. "Proc. IRE", December 1956, pages 1703–1705, "A Third Method of Generation and Detection of Single-Sideband Signals".

In such circuits, especially if they are used to convert the transmitted composite television signal in accordance with the PAL or NTSC television standard, an exact 90° phase difference and amplitude identity are required for the two quadrature-signal paths, namely the paths for the first and second quadrature analog signals, respectively, because otherwise picture disturbance and audio interference would result.

A disadvantage of the prior art control circuit is that the phase control stage acts on the sensitive 90° phase shift of the radio-frequency oscillator in the radio-frequency quadrature mixer. Another disadvantage is that the phase deviation is determined by a phase comparison in the baseband, i.e., at low frequencies, while the phase adjustment is performed on the highfrequency side, which is unfavorable from a control point of view because of the great frequency difference in the direct conversion technique. A further disadvantage of the prior art control circuit is that the amplitude control stage responds only to pure amplitude changes. By contrast, the amplitude identity of the two signal paths should relate to the amplitude identity of equal frequency components of each of the two quadrature analog signals.

SUMMARY OF THE INVENTION

Accordingly, the object of the invention as claimed is to provide a control circuit which controls the two signals approximately 90° apart in phase so as to obtain a phase difference of exactly 90°, makes them as equal in amplitude as possible with respect to the respective frequency components, and is suitable, at least in part, for monolithic integration.

BRIEF DESCRIPTION OF THE DRAWINGS

The invention will now be explained in more detail with reference to the accompanying drawings, in which.

DESCRIPTION OF THE PREFERRED EMBODIMENT

The fundamental idea of the invention is to digitize the first and second quadrature analog signals s1, s2 and to perform the phase and amplitude control with the help of digital circuits, which process data instead of analog values. The phase control stage pr has no feedback on the radio-frequency side, but it only changes the data of the two digitized quadrature analog signals according to the measured phase difference; to distinguish the two digitized quadrature analog signals from the first and second quadrature analog signals s1, s2, they will henceforth be called "first digital signal d1" and "second digital signal d2". The signals provided by the phase control stage pr are the first and second phase-corrected digital signal p1, p2.

The two output signals of the control circuit r are the first and second quadrature signals q1, q2, and, thus, represent two corrected digital signals. These first and second quadrature signals q1, q2 and the first and second phase-corrected digital signals p1, p2 are fed to the amplitude control stage ar. In the latter, amplitude values of the first and second quadrature signals q1, q2 are compared at signal frequencies which should be as identical as possible, and the difference value resulting from the comparison is used to correct the amplitudes of the first and second phase-corrected digital signals p1, p2.

If the first and second quadrature analog signals s1, s2 contain a composite color signal, the amplitude comparison takes place only during the horizontal synchronizing pulse, because the picture carrier is transmitted with constant amplitude and constant frequency only during that time. Outside the duration of the horizontal synchronizing pulse, a rather inconstant amplitude and frequency mixture of the modulated picture, color, and at least one modulated sound carrier is mostly present.

If the first and second quadrature analog signals s1, s2 are pure audio signals, the amplitude comparison in the amplitude control stage ar is based to advantage on a comparison of the root-mean-square (RMS) values of the first and second quadrature signals q1, q2. In this manner, a sufficient approximation to the amplitude comparison of equal frequency components is achieved.

A special advantage of the invention consists in the fact that the digitization of the two signal paths originating from the first and second quadrature analog signals s1, s2 and the design of the phase control stage pr and the amplitude control stage ar not only prevent any influence on the radio-frequency side, but that the digitization avoids the unwanted interaction of the first and second signal paths. Furthermore, the digitization makes it possible to achieve any desired accuracy and likeness of the two signal paths without any alignment steps. This depends only on the data-word width used. The accuracy of the phase and amplitude control can thus be so high that the accuracy requirements imposed on the radio-frequency quadrature mixer can be reduced to the point that this mixer is realizable as a monolithic integrated circuit.

In FIG. 1, the first and second quadrature analog signals s1 and s2, which come from the radio-frequency quadrature mixer (not shown), are fed to the first and second analog-to-digital converters w1 and w2 and converted to the first and second digital signals d1 and d2, respectively, each of which is applied to one input of the control circuit r. In the control circuit r, the first and second digital signals d1 and d2 are each fed to one input of the phase control stage pr, whose two other inputs are supplied with one of the output signals of the control circuit r, i.e., with the first quadrature signal q1 and the second quadrature signal q2, respectively. The first and second phase-corrected digital signals p1 and p2 are applied to the amplitude control stage ar. At two additional inputs, the first and second quadrature signals q1 and q2 are applied to the amplitude control stage ar. The signals from the amplitude control stage ar are also the output signals of the control circuit r, i.e., the first and second quadrature signals q1, q2, which are fed to the low-frequency quadrature mixer (not shown) for further processing.

Figure 2:
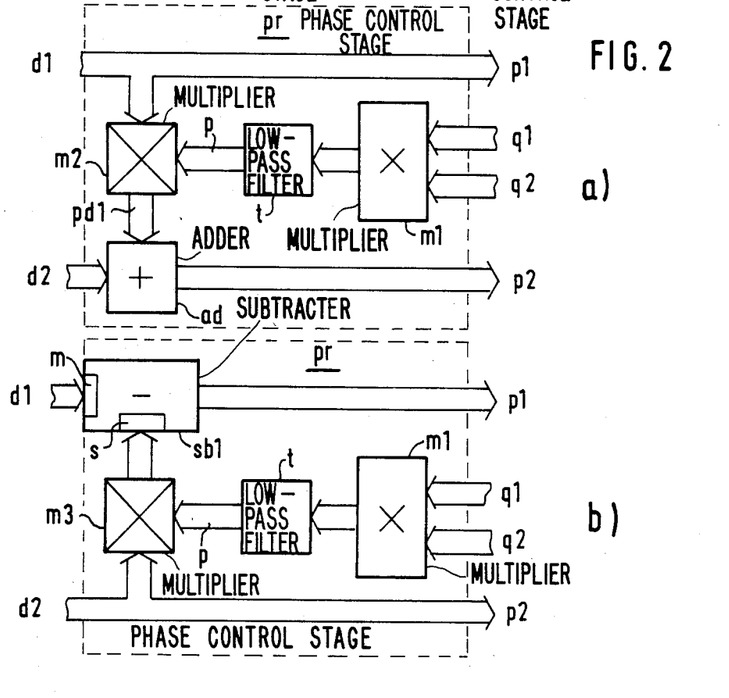
FIGS. 2a and 2b are block diagrams of two embodiments of the phase control stage.

FIG. 2a is a block diagram of a first embodiment of the phase control stage pr. The two inputs of the first multiplier m1 are supplied with the first quadrature signal q1 and the second quadrature signal q2, respectively, and the output of the multiplier is connected to the input of the low-pass filter t, whose output, the phase control value p, is fed to the first input of the second multiplier m2. If the first and second quadrature signals q1 and q2 differ in phase by exactly 90°, the pase control value p is zero. The second input of the multiplier m2 is presented with the third digital signal d1, which is also the first output signal of the phase control stage pr; in this embodiment, it is thus identical with the first phase-corrected digital signal p1. The second output signal is the second phase-corrected digital signal p2, which is the sum signal formed in the adder ad from the second digital signal d2 and the output signal of the second multiplier m2.

FIG. 2b shows another embodiment of the phase control stage pr. The phase control value p, which results from the multiplication together of the first and second quadrature signals q1 and q2 and the action of the low-pass filter t, is fed to the first input of the third multiplier m3, whose second input is supplied with the second digital signal d2, which is also the second phase-corrected digital signal p2. The output of the third multiplier m3 feeds the subtrahend input s of the first subtracter sb1, whose minuend input m is supplied with the first digital signal d1. The signal provided by the first subtracter sb1 is the first phase-corrected digital signal p1.

Depending on the embodiment, the phase control value p and the first or second digital signal d1, d2 form a product which is added to the second digital signal d2 or subtracted from the first digital signal d1, respectively. The resultant second or first phase-corrected digital signal p2, p1 now has the correct phase position, but the amplitude values do not agree yet. On the one hand, the phase control just described changes the original amplitude ratio, and on the other hand, the amplitude errors also originate from the erroneous radio-frequency quadrature mixing and from inequalities between the two analog signal transmission paths. Amplitude equality is restored in the amplitude control stage ar, which follows the phase control stage pr.

Figure 3:
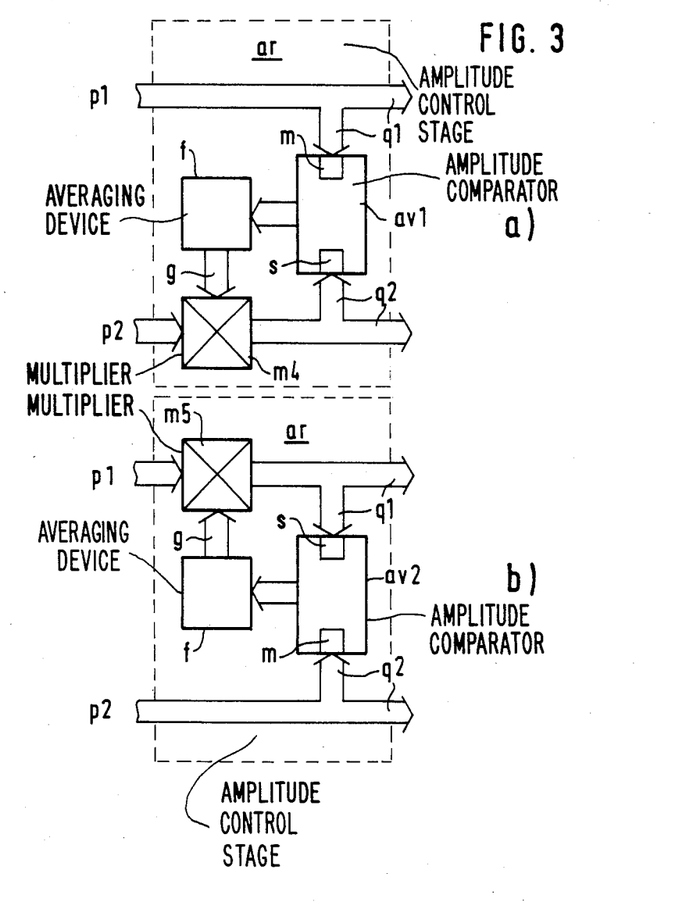
FIGS. 3a and 3b are block diagrams of two embodiments of the amplitude control stage.

FIG. 3a is a block diagram of a first embodiment of the amplitude control stage ar. The first phase-corrected digital signal p1 is also one of the output signals of this stage, namely the first quadrature signal q1, and is applied to the minuend input m of the first amplitude comparator av1. The subtrahend input s of the latter is presented with the second quadrature signal q2, which is the signal from the fourth multiplier m4. The output of the first amplitude comparator av1 is coupled to the input of the averaging device f, whose output, the amplitude control value g, is fed to the first input of the fourth multiplier m4. The latter thus forms the product of the amplitude control value g and the second phase-corrected digital signal p2, which is applied at the second input. The product is the second quadrature signal q2.

In another embodiment of the amplitude control stage ar, shown in FIG. 3b, the first quadrature signal q1 is produced by multiplying together the amplitude control value g and the first phase-corrected digital signal p1 in the fifth multiplier m5. Since the amplitude correction is thus performed on the first phase-corrected digital signal p1, in comparison with the first amplitude comparator av1 of FIG. 3a, the minuend input m and the subtrahend input s of the second amplitude comparator av2 have been interchanged with respect to the first and second quadrature signals q1, q2. The minuend input m of the second amplitude comparator av2 is presented with the second quadrature signal q2, which is also the second phase-corrected digital signal p2. The subtrahend input s of the second phase comparator av2 is supplied with the first quadrature signal q1, which is the signal from the fifth multiplier m5. The output of the second amplitude comparator av2 is connected to the input of the averaging device f, whose output, the amplitude control value g, is fed to the first input of the fifth multiplier m5. The second input of the latter is presented with the first phase-corrected digital signal p1.

The two amplitude comparators av1, av2 are basically subtracters, for which reason their inputs have been termed "minuend input", m, and "subtrahend input", s. The fourth and fifth multipliers m4, m5 correspond to the signal amplifiers in the prior art referred to above.

Figure 4:
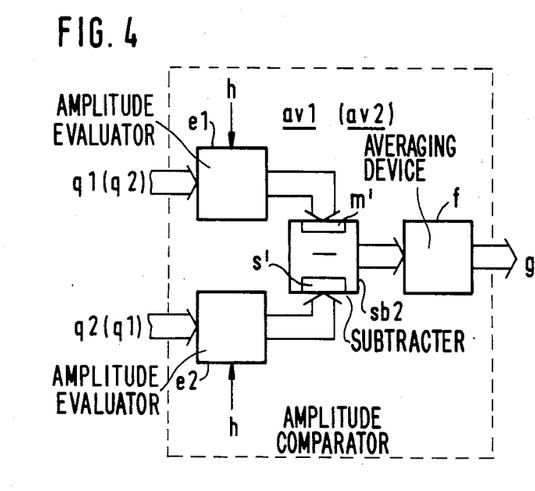
FIG. 4 is a block diagram of an embodiment of the amplitude comparator.

FIG. 4 shows an embodiment of the first amplitude comparator av1 or the second amplitude comparator av2 in a block diagram. Each of the amplitude comparators consists of a second subtracter sb2 having a first amplitude evaluator e1 and a second amplitude evaluator e2 connected ahead of its minuend input m' and its subtrahend input s', respectively. The assignment of the input signals is the same as in FIG. 3a or 3b. During the keying pulse h, the respective input data is transferred into the amplitude evaluators e1, e2. The keying pulse h is generated by subcircuits not described here, in the case of a composite color signal preferably during the horizontal synchronizing pulse, and is also fed to the amplitude evaluator e2. The signal from the second subtracter sb2 is applied to the input of the averaging device f, which delivers the amplitude control value g.

In the embodiment just described, each of the first and second amplitude evaluators e1, e2 can be an absolute-value device which determines the absolute value of the respective amplitude maximum during the measurement interval, particularly during the horizontal synchronizing pulse of the composite color signal, the amplitude maximum being determined either by individual comparisons or mathematically as an average maximum by forming an envelope from a number of individual measurements.

On the other hand, the first and second amplitude evaluators e1, e2 can be root-mean-square devices, particularly if the first and second quadrature signals q1, q2 are signals from a composite audio signal. In that case, the keying by means of the keying pulse h is not necessary.

Furthermore, the use of filter circuits in the first and second amplitude evaluators e1, e2 permits a further improvement of the amplitude evaluation with respect to the particular frequency ranges.

Figure 5:
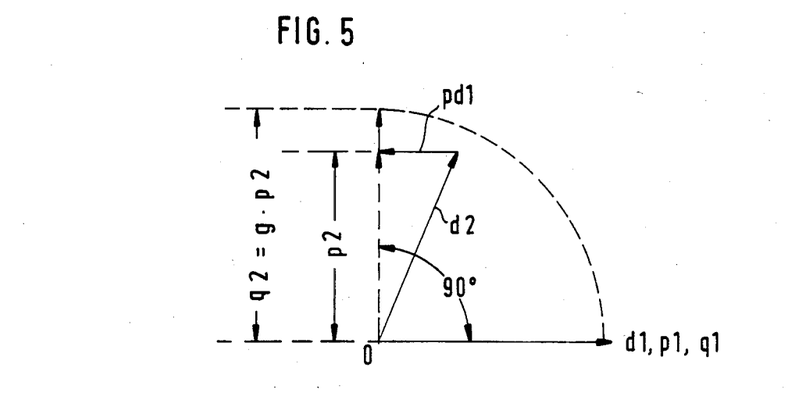
FIG. 5 is a vector diagram serving to explain the operation of the control circuit.

The vector diagram of FIG. 5 serves to illustrate the operation of the control circuit r with respect to first and second digital signals d1, d2 not differing in phase by 90° in connection with the embodiment of the phase control stage pr of FIG. 2a and the amplitude control stage ar of FIG. 3a. The vector representing the first digital d1, the first phase-corrected digital signal p1, and the first quadrature signal q1 is horizontal.

The angular distance of the vector representing the second digital signal d2 from the first digital signal d1 is less than 90° as assumed hereinabove, and the magnitude of this vector is smaller than that of the first digital signal d1. Since the phase difference is less than 90°, the phase control value p is negative. Hence, the phase correction value pd1, obtained in the second multiplier m2 as the product of the first data signal d1 and the phase control value p, is negative, too, if the direction of the vector of the first digital signal d1 is the positive one.

The vector addition of the second digital signal d2 and the phase correction value pd1 results in the vertical vector, which corresponds to the second phase-corrected digital signal p2. The position of this vector now has a phase difference of exactly 90° from the first digital signal, but the magnitude of the vector is not yet equal to the magnitude of the vector of the first digital signal d1. In the amplitude control stage ar, the amplitude control value g is multiplied by the second phase-corrected digital signal p2, and this product g x p2 represents the second quadrature signal q2 of correct amplitude and correct phase position. With that the control process of the control circuit r is completed.

To suppress the vestigial sideband with residual carrier, identical low-pass filters are required on the LF side in the first and second signal paths. To suppress distortions within the baseband, the position and steepness of the filters' Nyquist slopes have to be chosen according to the kind of vestigial sideband transmission used. These low-pass filters are preferably implemented as first and second digital low-pass filters of identical frequency response, and are inserted, respectively, between the first analog-to-digital converter w1 and the associated input of the control circuit r and between the second analog-to-digital converter w2 and the associated control-circuit input. This permits identical amplitude and frequency responses in both signal paths, the digital filters being suitable for monolithic integration. Such digital filters are not subject to any manufacturing variations or aging processes, of course, and need not be aligned. The first and second analog-to-digital converters w1, w2 must each be preceded by a simple analog filter stage for suppressing signal frequencies above the baseband; such a filter stage may also consist of several individual filter sections. The tolerance requirements imposed on this filter stage can be met with analog integrable means, such as resistors, capacitors, and current sources. Thus, the control circuit r, in conjunction with the direct frequency conversion from the radio-frequency composite signal to the baseband by the "third method", permits the implementation of a frequency-conversion method suitable for consumer-oriented equipment.

I claim:

1. A circuit for controlling first and second quadrature analog signals approximately 90° apart in phase so as to obtain two signal waveforms having a phase difference of exactly 90° and exactly equal amplitudes, said circuit comprising:

first and second analog-to-digital converters responsively coupled to receive said first and second quadrature analog signals, respectively, said first and second analog-to-digital converters providing respective first and second digital signals as outputs;

a digital control circuit responsively coupled to said first and second analog-to-digital converters, said digital control circuit receiving said first and second digital signals and generating first and second quadrature digital signals, said digital control circuit comprising:

a phase control stage that provides first and second phase-corrected digital signals, said phase control stage comprising:

a first multiplier having first and second inputs and an output, said first and second inputs connected to receive said first and second quadrature digital signals, respectively;

a low-pass filter having an input and an output, said input connected to said output of said first multiplier, said output of said low-pass filter being a phase control value;

a second multiplier having first and second inputs and an output, said first input connected to said output of said low-pass filter, said second input receiving one of said first and second digital signals, said one of said first and second digital signals also provided as the corresponding one of said first and second phase-corrected digital signal outputs of said phase control stage; and an arithmetic unit having first and second inputs and an output, said first input connected to said output of said second multiplier, said second input connected to the other of said first and second digital signals, said output of said arithmetic unit provided as the corresponding other of said first and second phase-corrected digital signal outputs of said phase control stage; and an amplitude control stage that adjusts the amplitudes of respective frequency components of said first and second quadrature digital signals to be substantially identical, said amplitude control stage receiving said first and second phase-corrected digital signals from said phase control stage and providing said first and second quadrature digital signals as outputs, said amplitude control stage comprising:

an amplitude comparator having a minuend input, a subtrahend input and an output, said minuend input of said amplitude comparator connected to one of said first and second phase-corrected digital signals, said one of said first and second phase-corrected digital signals further being provided as one of said first and second quadrature digital signals, said one of said first and second quadrature digital signals corresponding to said one of said first and second phase-corrected digital signals;

an averaging device having an input and an output, said input connected to said output of said amplitude comparator; and a signal amplifier, said signal amplifier being a third multiplier having first and second inputs and an output, said first input connected to said output of said averaging device, said second input connected to the other of said first and second phase-corrected digital signals, said output of said third multiplier connector to said subtrahend input of said amplitude comparator, said output of said third multiplier further being provided as the quadrature digital signal output of said amplitude control circuit and said digital control circuit corresponding to said other.

2. The circuit as defined in claim 2, wherein said arithmetic unit is an adder.

3. The circuit as defined in claim 2, wherein said arithmetic unit is a subtracter.

4. A circuit for controlling first and second quadrature analog signals approximately 90° apart in phase so as to obtain two signal waveforms having a phase difference of exactly 90° and exactly equal amplitudes, said circuit comprising:

a first analog-to-digital converter responsively coupled to receive said first quadrature analog signal, said first analog-to-digital converter providing a first digital signal;

a second analog-to-digital converter responsively coupled to receive said second quadrature analog signal, said second analog-to-digital converter providing a second digital signal;

a digital control circuit responsively coupled to said first and second analog-to-digital converters, said digital control circuit receiving said first and second digital signals and generating first quadrature digital signal and a second quadrature digital signal, said digital control circuit comprising:

a phase control stage that provides first and second phase-corrected digital signals, said phase control stage comprising:

a first multiplier having first and second inputs and an output, said first and second inputs connected to receive said first and second quadrature digital signals, respectively;

a low-pass filter having an input and an output, said input connected to said output of said first multiplier, said output of said low-pass filter being a phase control value;

a second multiplier having first and second inputs and an output, said first input connected to said output of said low-pass filter, said second input receiving said first digital signal, said first digital signal also provided as the first phase-corrected digital signal output of said phase control stage; and an adder having first and second input and an output, said first input connected to said output of said second multiplier, said second input connected to said second digital signal, said output of said adder being a sum signal that is provided as said second phase-corrected digital output of said phase control stage; and an amplitude control stage that adjusts the amplitudes of respective frequency components of said first and second quadrature digital signals to be substantially identical, said amplitude control stage receiving said first and second phase-corrected digital signals from said phase control stage and providing said first and second quadrature digital signals as outputs, said amplitude control stage comprising:

an amplitude comparator having a minuend input, a subtrahend input and an output, said minuend input of said amplitude comparator connected to said first phase-corrected digital signal, said first phase-corrected digital signal further being provided as said first quadrature digital signal;

an averaging device having an input and an output, said input connected to said output of said amplitude comparator; and a signal amplifier, said signal amplifier being a third multiplier having first and second inputs and an output, said first input connected to said output of said averaging device, said second input connected to said second phase-corrected digital signal, said output of said third multiplier connected to said subtrahend input of said amplitude comparator, said output of said third multiplier further being provided as said second quadrature digital signal output of said amplitude control circuit and said digital control circuit.

5. The circuit as defined in claim 4, wherein said amplitude comparator comprises:

a subtracter having a minuend input, s subtrahend input and an output;

a first amplitude evaluator having an input corresponding to said minuend input of said amplitude comparator, said input connected to receive said first quadrature digital signal, and having an output connected to said minuend input of said substracter;

a second amplitude evaluator having an input corresponding to said subtrahend input of said amplitude comparator, said input connected to receive said second quadrature digital signal, and having an output connected to said subtrahend input of said subtracter; and an averaging device having an input connected to said output of said subtracter and having an output that corresponds to said output of said amplitude comparator.

6. The circuit as defined in claim 5, wherein said first and second amplitude evaluators comprise absolute-value devices which determine the absolute value of the respective amplitude maximum during a measurement interval during the horizontal synchronizing pulse of the composite color signal, the amplitude maximum being determined by one of (i) individual comparisons during said measurement interval, and (ii) mathematically determining an average maximum amplitude by forming an envelope from a number of individual measurements.

7. The circuit as defined in claim 5, wherein said first and second amplitude evaluators comprise root-mean-square devices. ·

8. The circuit as defined in claim 4, wherein said first and second quadrature analog signals originate from a signal which is one of a composite color signal and an audio signal.

9. The circuit as defined in claim 4, wherein said control circuit and said first and second analog-to-digital converters are constructed as part of a monolithic integrated circuit.

10. The circuit as defined in claim 4, further including first and second analog filter stages connected to the inputs of said first and second analog-to-digital converters, respectively, said first and second analog filters suppressing signal frequencies above the baseband in said first and second quadrature analog signals applied to the inputs of said first and second analog-to-digital converters.

11. The circuit as defined in claim 4, further including first and second digital low-pass filters interposed between the respective outputs of said first and second analog-to-digital converters and the corresponding input of said control circuit.

12. A circuit for controlling first and second quadrature analog signals approximately 90° apart in phase so as to obtain two signal waveforms having a phase difference of exactly 90° and exactly equal amplitudes, said circuit comprising:
a first analog-to-digital converter responsively coupled to receive said first quadrature analog signal, said first analog-to-digital converter providing a first digital signal;
a second analog-to-digital converter responsively coupled to receive said second quadrature analog signal, said second analog-to-digital converter providing a second digital signal;
a digital control circuit responsively coupled to said first and second analog-to-digital converters, said digital control circuit receiving said first and second digital signals and generating a first quadrature digital signal and a second quadrature digital signal, said digital control circuit comprising:
a phase control stage that provides first and second phase-corrected digital signals, said phase control stage comprising:
a first multiplier having first and second inputs and an output, said first and second inputs connected to receive said first and second quadrature digital signals, respectively;
a low-pass filter having an input and an output, said input connected to said output of said first multiplier, said output of said low-pass filter being a phase control value;
a second multiplier having first and second inputs and an output, said first input connected to said output of said low-pass filter, said second input receiving said second digital signal, said second digital signal also provided as the second phase-corrected digital signal output of said phase control stage; and
a subtracter having a minuend input, a subtrahend input and an output, said subtrahend input connected to said output of said second multiplier, said minuend input connected to said first digital signal, said output of said subtracter being a difference signal that is provided as said first phase-corrected digital signal output of said phase control stage; and
an amplitude control stage that adjusts the amplitudes of respective frequency components of said first and second quadrature digital signals to be substantially identical, said amplitude control stage receiving said first and second phase-corrected digital signals from said phase control stage and providing said first and second quadrature digital signals as outputs, said amplitude control stage comprising:
an amplitude comparator having a minuend input, a subtrahend input and an output, said minuend input of said amplitude comparator connected to said first phase-corrected digital signal, said first phase-corrected digital signal further being provided as said first quadrature digital signal;
an averaging device having an input and an output, said input connected to said output of said amplitude comparator; and
a signal amplifier, said signal amplifier being a third multiplier having first and second inputs and an output, said first input connected to said output of said averaging device, said second input connected to said second phase-corrected digital signal, said output of said third multiplier connected to said subtrahend input of said amplitude comparator, said output of said third multiplier further being provided as said second quadrature digital signal output of said amplitude control circuit and said digital control circuit.

13. The circuit as defined in claim 12, wherein said amplitude comparator comprises:
a subtracter having a minuend input, a subtrahend input and an output;
a first amplitude evaluator having an input corresponding to said minuend input of said amplitude comparator, said input connected to receive said first quadrature digital signal, and having an output connected to said minuend input of said subtracter;
a second amplitude evaluator having an input corresponding to said subtrahend input of said amplitude comparator, said input connected to receive said second quadrature digital signal, and having an output connected to said subtrahend input of said subtracter; and
an averaging device having an input connected to said output of said subtracter and having an output that corresponds to said output of said amplitude comparator.

14. The circuit as defined in claim 13, wherein said first and second amplitude evaluators comprise absolute-value devices which determine the absolute value of the respective amplitude maximum during a measurement interval during the horizontal synchronizing pulse of the composite color signal, the amplitude maximum being determined by one of (i) individual comparisons during said measurement interval, and (ii) mathematically determining an average maximum amplitude by forming an envelope from a number of individual measurements.

15. The circuit as defined in claim 13, wherein said first and second amplitude evaluators comprise root-mean-square devices.

16. The circuit as define in claim 12, wherein said first and second quadrature analog signals original from a signal which is one of a composite color signal and an audio signal.

17. The circuit as defined in claim 12, wherein said control circuit and said first and second analog-to-digital converters are constructed as part of a monolithic integrated circuit.

18. The circuit as defined in claim 12, further including first and second analog filter stages connected to the inputs of said first and second analog-to-digital converters, respectively, said first and second analog filters suppressing signal frequencies above the baseband in said first and second quadrature analog signals applied to the inputs of said first and second analog-to0digital converters.

19. The circuit as defined in claim 12, further including first and second digital low-pass filters interposed between the respective outputs of said first and second analog-to-digital converters and the corresponding inputs of said control circuit.

20. A circuit for controlling first and second quadrature analog signals approximately 90° apart in phase so as to obtain two signal waveforms having a phase difference of exactly 90° and exactly equal amplitudes, said circuit comprising:
- a first analog-to-digital converter responsively coupled to receive said first quadrature analog signal, said first analog-to-digital converter providing a first digital signal;
- a second analog-to-digital converter responsively coupled to receive said second quadrature analog signal, said second analog-to-digital converter providing a second digital signal;
- a digital control circuit responsively coupled to said first and second analog-to-digital converters, said digital control circuit receiving said first and second digital signals and generating a first quadrature digital signal and a second quadrature digital signal, said digital control circuit comprising:
- a phase control stage that provides first and second phase-corrected digital signals, said phase control stage comprising:
  - a first multiplier having first and second inputs and an output, said first and second inputs connected to receive said first and second quadrature digital signals, respectively;
  - a low-pass filter having an input and an output, said input connected to said output of said first multiplier, said output of said low-pass filter being a phase control value;
  - a second multiplier having first and second inputs and an output, said first input connected to said output of said low-pass filter, said second input receiving said first digital signal, said first digital signal also provided as the first phase-corrected digital signal output of said phase control stage; and
  - an adder having first and second inputs and an output, said first input connected to said output of said second multiplier, said second input connected to said second digital signal, said output of said adder being a sum signal that is provided as said second phase-corrected digital signal output of said phase control stage; and
- an amplitude control state that adjusts the amplitudes of respective frequency components of said first and second quadrature digital signals to be substantially identical, said amplitude control stage receiving said first and second phase-corrected digital signals from said phase control stage and providing said first and second quadrature digital signals as outputs, said amplitude control stage comprising:
  - an amplitude comparator having a minuend input, a subtrahend input and an output, said minuend input of said amplitude comparator connected to said second phase-corrected digital signal, said second phase-corrected digital signal further being provided as said second quadrature digital signal;
  - an averaging device having an input and an output, said input connected to said output of said amplitude comparator; and
  - a signal amplifier, said signal amplifier being a third multiplier having first and second inputs and an output, said first input connected to said output of said averaging device, said second input connected to said first phase-corrected digital signal, said output of said third multiplier connected to said subtrahend input of said amplitude comparator, said output of said third multiplier further being provided as said first quadrature digital signal output of said amplitude control circuit and said digital control circuit.

21. The circuit as defined in claim 20, wherein said amplitude comparator comprises:
- a subtracter having a minuend input, a subtrahend input and an output;
- a first amplitude evaluator having an input corresponding to said minuend input of said amplitude comparator, said input connected to receive said second quadrature digital signal, and having an output connected to said minuend input of said subtracter;
- a second amplitude evaluator having an input corresponding to said subtrahend input of said amplitude comparator, said input connected to receive said first quadrature digitl signal, and having an output connected to said subtrahend input of said subtracter; and
- an averaging device having an input connected to said output of said subtracter and having an output that corresponds to said output of said amplitude comparator.

22. The circuit as defined in claim 21, wherein said first and second amplitude evaluators comprise absolute-value devices which determine the absolute value of the respective amplitude maximum during a meaurement interval during the horizontal synchronizing pulse of the composite color signal, the amplitude maximum being determined by one of (i) individual comparisons during said measurement interval, and (ii) mathematically determining an average maximum amplitude by forming an envelope from a number of individual measurements.

23. The circuit as defined in claim 21, wherein said first and second amplitude evaluators comprise root-mean-square devices.

24. The circuit as defined in claim 20, wherein said first and second quadrature analog signals originate from a signal which is one of a composite color signal and an audio signal.

25. The circuit as defined in claim 20, wherein said control circuit and said first and second analog-to-digital converters are constructed as part of a monolithic integrated circuit.

26. The circuit as defined in claim 20, further including first and second analog filter stages connected to the inputs of said first and second analog-to-digital converters, respectively, said first and second analog filters suppressing signal frequencies above the baseband in said first and second quadrature analog signals applied to the inputs of said first and second analog-to-digital converters.

27. The circuit as defined in claim 20, further including first and second digital low-pass filters interposed between the respective outputs of said first and second analog-to-digital converters and the corresponding inputs of said control circuit.

28. A circuit for controlling first and second quadrature analog signals approximately 90° apart in phase so as to obtain two signal waveforms having a phase difference of exactly 90° and exactly equal amplitudes, said circuit comprising:

a first analog-to-digital converter responsively coupled to receive said first quadrature analog signal, said first analog-to-digital converter providing a first digital signal;

a second analog-to-digital converter responsively coupled to receive said second quadrature analog signal, said second analog-to-digital converter providing a second digital signal;

a digital control circuit responsively coupled to said first and second analog-to-digital converters, said digital control circuit receiving said first and second digital signals and generating a first quadrature digital signal and a second quadrature digital signal, said digital control circuit comprising:

a phase control stage that provides first and second phase-corrected digital signals, said phase control stage comprising:

a first multiplier having first and second inputs and an output, said first and second inputs connected to receive said first and second quadrature digital signals, respectively;

a low-pass filter having an input and an output, said input connected to said output of said first multiplier, said output of said low-pass filter being a phase control value;

a second multiplier having first and second inputs and an output, said first input connected to said output of said low-pass filter, said second input receiving said second digital signal, said second digital signal also provided as the second phase-corrected digital output of said phase control stage; and a subtracter having a minuend input, a subtrahend input and an output, said subtrahend input connected to said output of said second multiplier, said minuend input connected to said first digital signal, said output of said subtracter being a difference signal that is provided as said first phase-corrected digital signal output of said phase control stage; and an amplitude control stage that adjusts the amplitudes of respective frequency components of said first and second quadrature digital signals to be substantially identical, said amplitude control stage receiving said first and second phase-corrected digital signals from said phase control stage and providing said first and second quadrature digital signals as outputs, said amplitude control stage comprising:

an amplitude comparator having a minuend input, a subtrahend input and an output, said minuend input of said amplitude comparator connected to said second phase-corrected digital signal, said second phase-corrected digital signal further being provided as said second quadrature digital signal;

an averaging device having an input and an output, said input connected to said output of said amplitude comparator; and a signal amplifier, said signal amplifier being a third multiplier having first and second inputs and an output, said first input connected to said output of said averaging device, said second input connected to said first phase-corrected digital signal, said output of said third multiplier connected to said subtrahend input of said amplitude comparator, said output of said third multiplier further being provided as said first quadrature digital signal output of said amplitude control circuit and said digital control circuit.

29. The circuit as defined in claim 28, wherein said amplitude comparator comprises:

a subtracter having a minuend input, a subtrahend input and an output;

a first amplitude evaluator having an input corresponding to said minuend input of said amplitude comparator, said input connected to receive said second quadrature digital signal, and having an output connected to said minuend input of said subtracter;

a second amplitude evaluator having an input corresponding to said subtrahend input of said amplitude comparator, said input connected to receive said first quadrature digital signal, and having an output connected to said subtrahend input of said subtracter; and an averaging device having an input connected to said output of said subtracter and having an output that corresponds to said output of said amplitude comparator.

30. The circuit as defined in claim 29, wherein said first and second amplitude evaluators comprise absolute-value devices which determine the absolute value of the respective amplitude maximum during a measurement interval during the horizontal synchronizing pulse of the composite color signal, the amplitude maximum being determined by one of (i) individual comparisons during said measurement interval, and (ii) mathematically determining an average maximum amplitude by forming an envelope from a number of individual measurements.

31. The circuit as defined in claim 29, wherein said first and second amplitude evaluators comprise root-mean-square devices.

32. The circuit as defined in claim 28, wherein said first and second quadrature analog signals originate from a signal which is one of a composite color signal and an audio signal.

33. The circuit as defined in claim 28, wherein said control circuit and said first and second analog-to-digital converters are constructed as part of a monolithic integrated circuit.

34. The circuit as defined in claim 29, further including first and second analog filter stages connected to the input of said first and second analog-to-digital converters, respectively, said first and second analog filters suppressing signal frequencies above the baseband in said first and second quadrature analog signals applied to the inputs of said first and second analog-to-digital converters.

35. The circuit as defined in claim 29, further including first and second digital low-pass filters interposed between the respective outputs of said first and second analog-to-digital converters and the corresponding inputs of said control circuit.

* * * * *